United States Patent
Chen et al.

(10) Patent No.: US 9,491,865 B1
(45) Date of Patent: Nov. 8, 2016

(54) CIRCUIT BOARD AND METHOD FOR MANUFACTURING THE SAME

(71) Applicant: Unimicron Technology Corp., Taoyuan (TW)

(72) Inventors: Yin-Ju Chen, Taoyuan (TW);
Ming-Hao Wu, Taoyuan (TW);
Cheng-Po Yu, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/695,057

(22) Filed: Apr. 24, 2015

(51) Int. Cl.
*H01L 35/30* (2006.01)
*H05K 1/18* (2006.01)
*H05K 1/02* (2006.01)
*H05K 1/11* (2006.01)
*H05K 3/46* (2006.01)
*H05K 3/30* (2006.01)
*H05K 3/40* (2006.01)

(52) U.S. Cl.
CPC ............ *H05K 1/185* (2013.01); *H01L 35/30* (2013.01); *H05K 1/0206* (2013.01); *H05K 1/111* (2013.01); *H05K 1/115* (2013.01); *H05K 3/30* (2013.01); *H05K 3/4038* (2013.01); *H05K 3/4647* (2013.01); *H05K 3/4697* (2013.01); *H05K 2201/10219* (2013.01)

(58) Field of Classification Search
CPC ................................ H01L 35/30; H01L 35/32
See application file for complete search history.

(56) References Cited

U.S. PATENT DOCUMENTS

| | | | |
|---|---|---|---|
| 5,921,087 A * | 7/1999 | Bhatia | F25B 21/02 136/203 |
| 6,459,582 B1 | 10/2002 | Ali et al. | |
| 6,570,362 B1 * | 5/2003 | Estes | H01L 23/38 136/205 |
| 8,048,794 B2 | 11/2011 | Knickerbocker | |
| 2002/0162339 A1 * | 11/2002 | Harrison | B67D 1/0869 62/3.7 |
| 2003/0034556 A1 * | 2/2003 | Voigtlaender | H01L 23/38 257/728 |
| 2005/0045702 A1 * | 3/2005 | Freeman | B23K 1/0016 228/254 |
| 2013/0270721 A1 | 10/2013 | Chiriac et al. | |
| 2013/0309899 A1 * | 11/2013 | Sehmbey | G06F 1/203 439/485 |

FOREIGN PATENT DOCUMENTS

| | | |
|---|---|---|
| EP | 1316140 B1 | 4/2014 |
| TW | M272365 U | 8/2005 |
| TW | 200718332 | 5/2007 |
| TW | 200741165 | 11/2007 |
| TW | M388106 U1 | 9/2010 |

* cited by examiner

*Primary Examiner* — Eli Mekhlin
(74) *Attorney, Agent, or Firm* — CKC & Partners Co., Ltd.

(57) ABSTRACT

A circuit board with a heat-recovery function includes a substrate, a heat-storing device, and a thermoelectric device. The heat-storing device is embedded in the substrate and connected to a processor for performing heat exchange with the processor. The thermoelectric device embedded in the substrate includes a first metal-junction surface and a second metal-junction surface. The first metal-junction surface is connected to the heat-storing device for performing heat exchange with the heat-storing device. The second metal-junction surface is joined with the first metal-junction surface, in which the thermoelectric device generates an electric potential by a temperature difference between the first metal-junction surface and the second metal-junction surface.

4 Claims, 11 Drawing Sheets

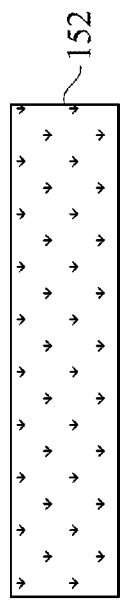
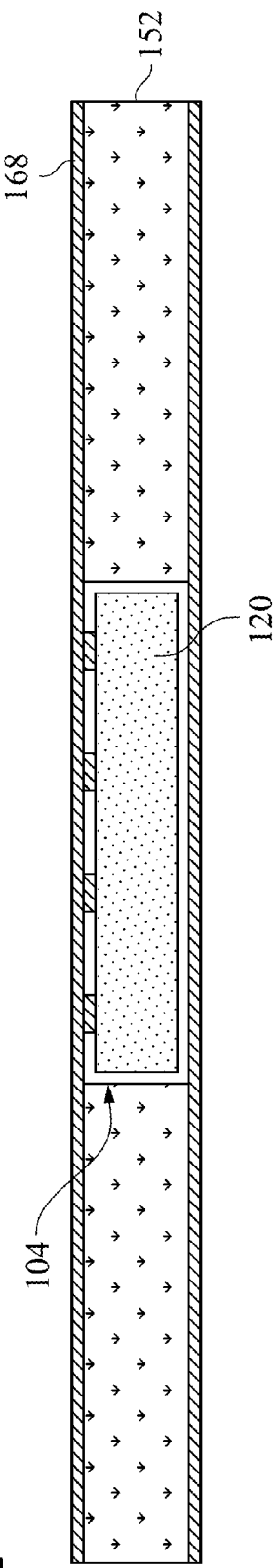
Fig. 2A
Fig. 2B

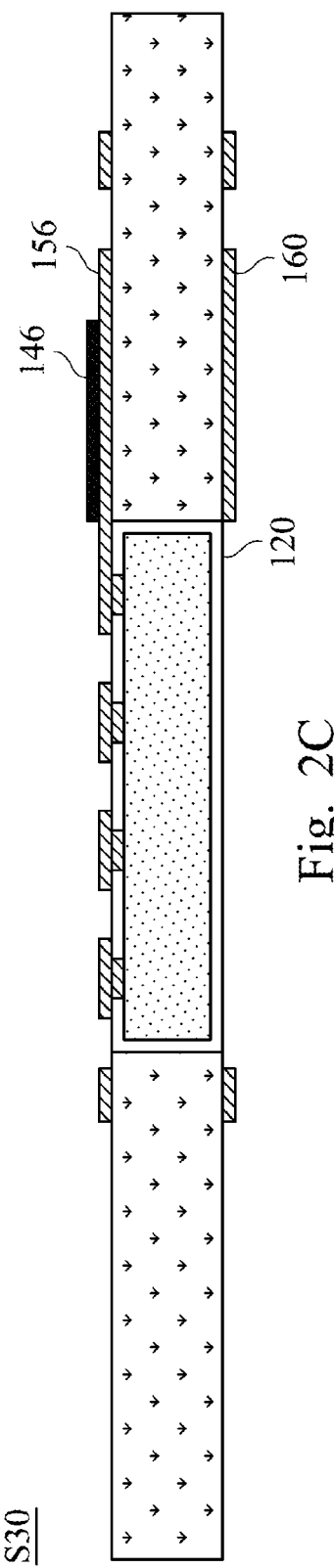
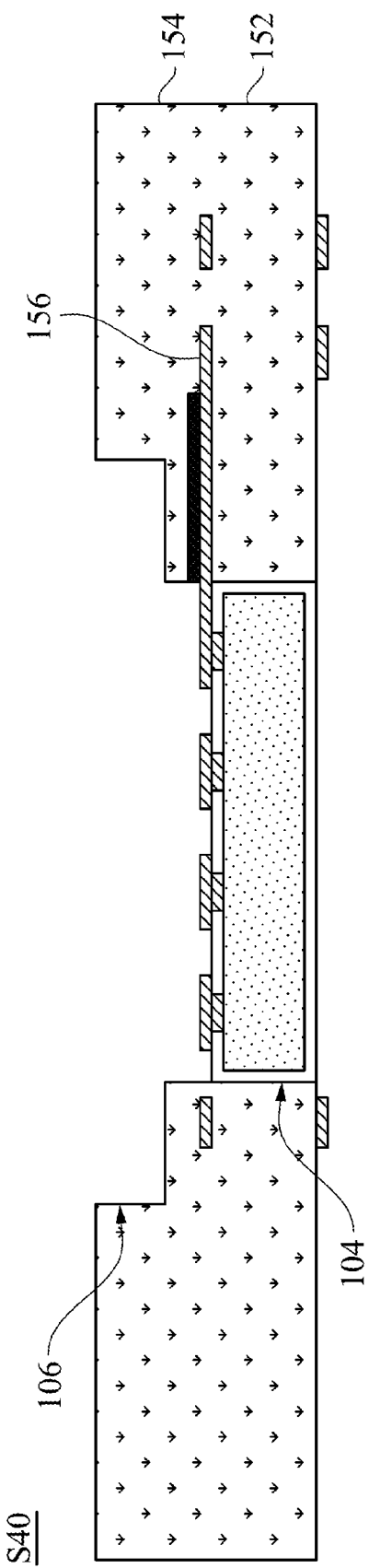

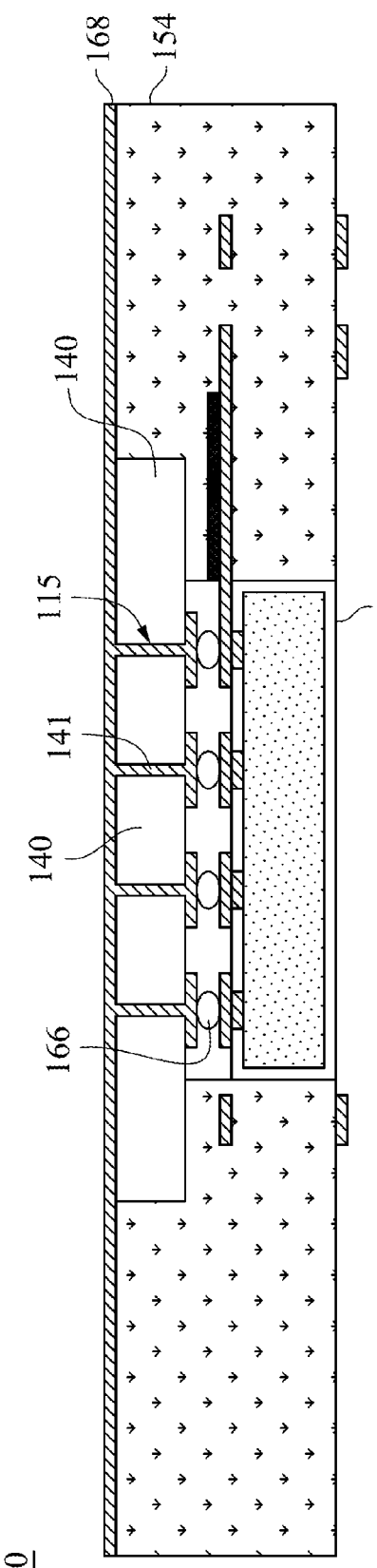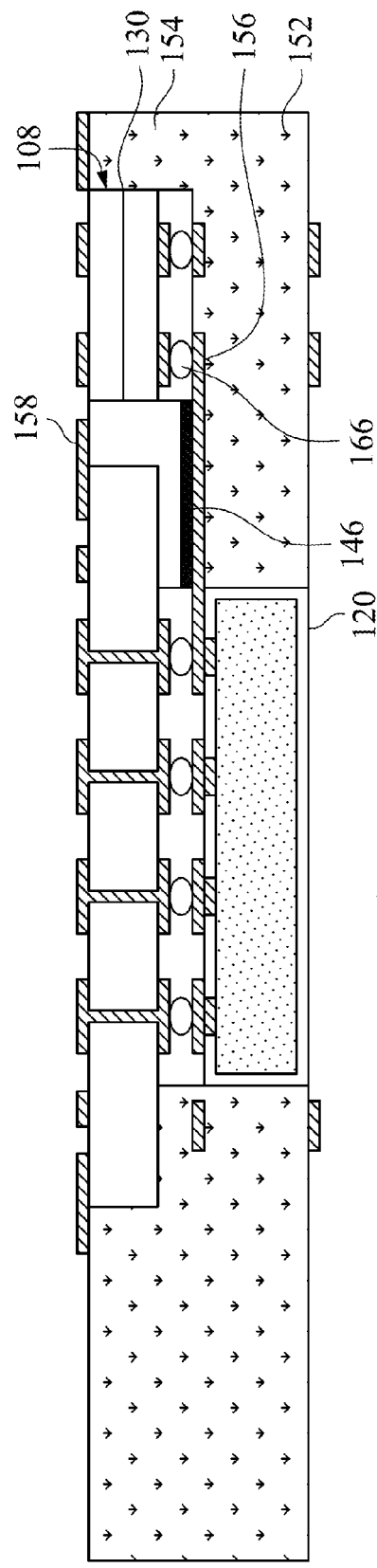

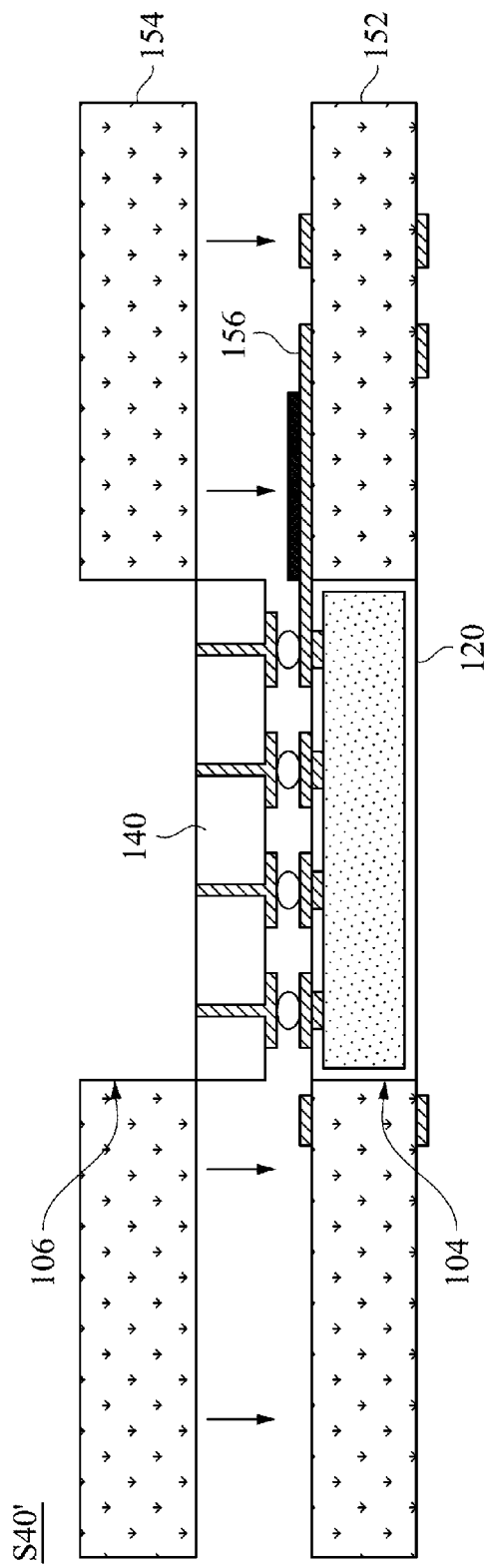
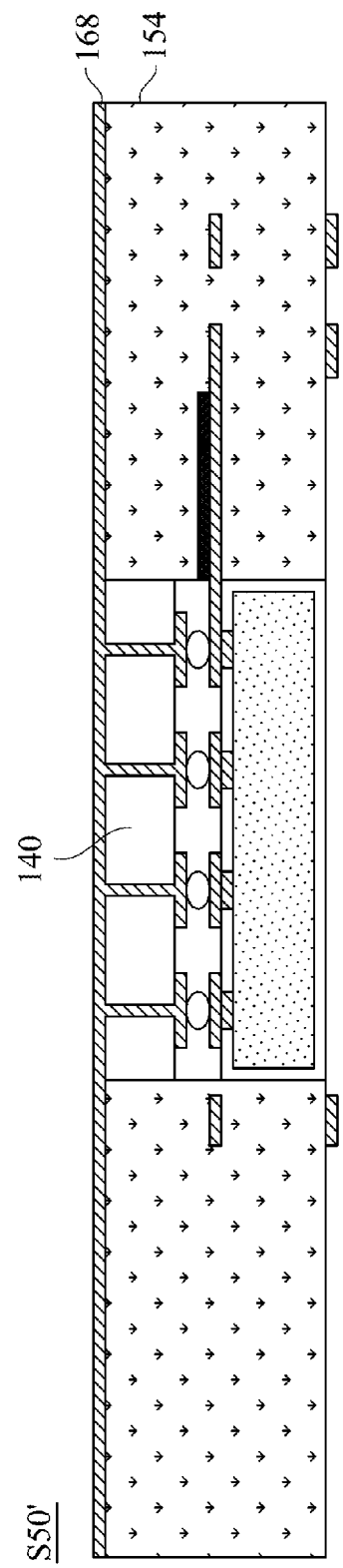

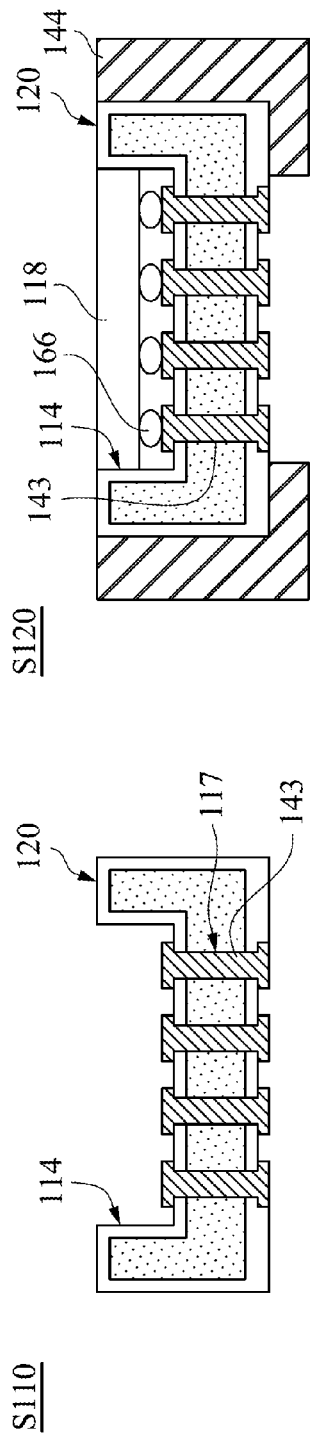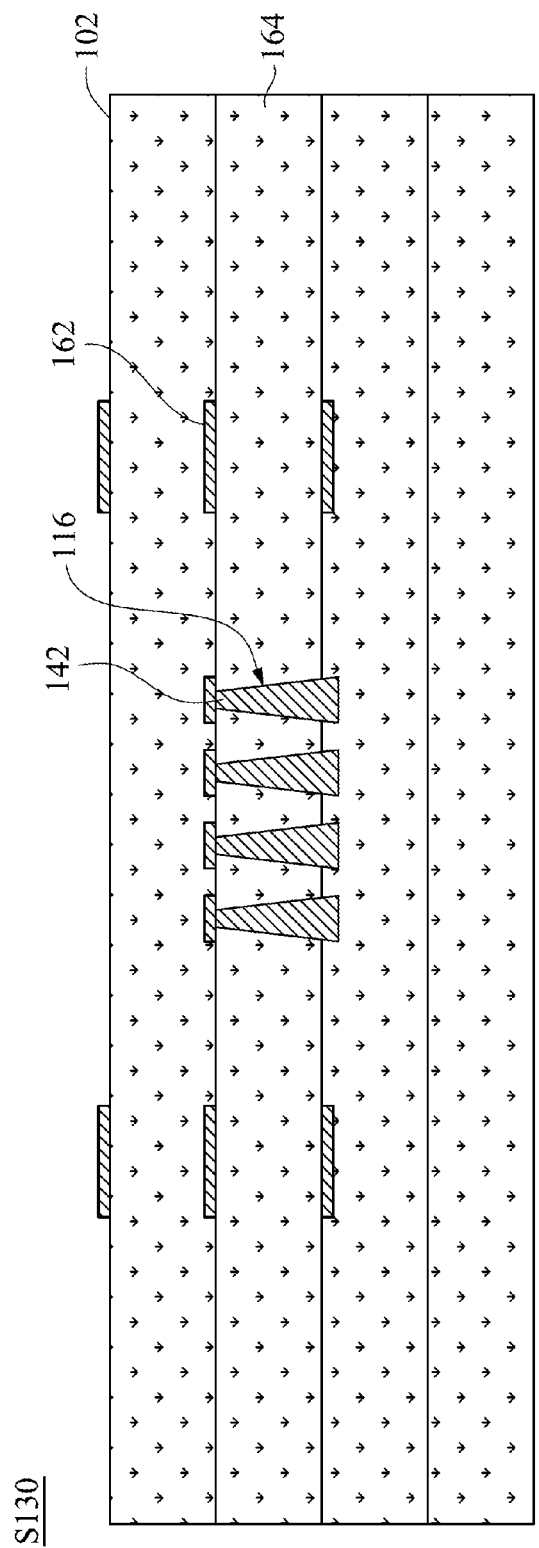

CIRCUIT BOARD AND METHOD FOR MANUFACTURING THE SAME

BACKGROUND

1. Field of Invention

The present invention relates to a circuit board. More particularly, the present invention relates to a circuit board with a heat-recovery function.

2. Description of Related Art

With an enhancement of computer performance, the power of the computer has been increased, and therefore a problem of waste heat accumulated in the computer has become more obvious. In order to make the operations of the computer perform more smoothly, a heat-dissipation structure is generally disposed on a processor of the computer. The waste heat accumulated in the processor can be transmitted from the processor to the outside by the heat-dissipation structure so as to prevent a system crash due to overheating caused by the waste heat accumulated in the processor.

The heat-dissipation structure commonly used nowadays is a heat sink, in which the heat sink can carry a thermal energy generated by the processor out by convection. However, the heat sink just carries the thermal energy generated by the processor out. That is, the heat sink does not have the properties which might enable it to handle the thermal energy potential which has been gathered by the waste heat.

SUMMARY

According to the problem caused by waste heat accumulating in a computer, an aspect of the present invention provides a circuit board including a heat-storing device and a thermoelectric device embedded in a substrate so as to convert a thermal energy generated by a processor into an electrical energy. That is, the waste heat generated by the processor can be utilized effectively. Furthermore, the thermal energy generated by the processor is stored in the heat-storing device of the circuit board during an operation of the processor. Therefore, the thermal energy stored in the heat-storing device can be converted into the electrical energy by the thermoelectric device after the operation of the processor is finished so as to supply the electrical energy to the other elements kept operating. In other words, the circuit board of the present invention is a circuit board including embedded components with a heat-recovery function.

An aspect of the present invention provides a circuit board with a heat-recovery function including a substrate, a heat-storing device, and a thermoelectric device. The heat-storing device is embedded in the substrate and connected to a processor for performing heat exchange with the processor. The thermoelectric device embedded in the substrate includes a first metal-junction surface and a second metal-junction surface. The first metal-junction surface is connected to the heat-storing device for performing heat exchange with the heat-storing device. The second metal-junction surface is joined with the first metal-junction surface, in which the thermoelectric device generates an electric potential by a temperature difference between the first metal-junction surface and the second metal-junction surface.

In some embodiments, the circuit board further includes an interposer board. The interposer board disposed between the heat-storing device and the processor includes at least one first via and a first heat-conducting pillar. The first via penetrates the interposer board. The first heat-conducting pillar is disposed in the first via, in which the heat-storing device performs heat exchange with the processor through the first heat-conducting pillar.

In some embodiments, the substrate further includes a first opening and a second opening. The first opening is disposed at a surface of the substrate, in which the heat-storing device is located in the first opening. The second opening is disposed at the other surface of the substrate and opposite the first opening, and the first opening and the second opening are communicated with each other. A width of the first opening is greater than the width of the second opening.

In some embodiments, the heat-storing device further includes a housing, a phase-change material, at least one connecting pad. The housing is filled with the phase-change material. The connecting pad is disposed at the housing, in which the first metal-junction surface of the thermoelectric device is connected to the phase-change material via the connecting pad.

In some embodiments, the substrate further includes a first recess, a second recess, at least one second via, and a second heat-conducting pillar. The first recess is disposed at a surface of the substrate, in which the thermoelectric device is located in the first recess. The second recess is disposed at the other surface of the substrate, in which the heat-storing device is located in the second recess. The first recess and the second recess are opposite to each other, and at least one portion of the substrate is located between the heat-storing device and the thermoelectric device. The second via is disposed at the portion of the substrate between the heat-storing device and the thermoelectric device between. The second heat-conducting pillar is disposed in the second via, in which the heat-storing device performs heat exchange with the thermoelectric device through the second heat-conducting pillar.

In some embodiments, the heat-storing device further includes a housing, a phase-change material, at least one third via, a third heat-conducting pillar. The housing is filled with the phase-change material. The third via penetrates the heat-storing device. The third heat-conducting pillar is disposed in the third via, in which the processor performs heat exchange with the first metal-junction surface of the thermoelectric device through the third heat-conducting pillar.

In some embodiments, the circuit board further includes a fixing frame. The fixing frame is disposed in the second recess, in which the heat-storing device is located in the fixing frame. The heat-storing device further includes a third recess. The processor is located in the third recess. The surfaces of the substrate, the fixing frame, the heat-storing device, and the processor are coplanar.

In some embodiments, the circuit board further includes a heat-conducting unit. The heat-conducting unit is disposed between the heat-storing device and the processor or between the heat-storing device and the thermoelectric device, in which the heat-conducting unit is made of metal, graphene or combinations thereof.

An aspect of the present invention provides a method for circuit board with a heat-recovery function. The method includes a number of steps. A first opening is formed in a first buildup-dielectric layer and a heat-storing device is disposed into the first opening for embedding the heat-storing device in the first buildup-dielectric layer. A first pattern-metal layer is disposed on the first buildup-dielectric layer and the heat-storing device. A second buildup-dielectric layer is disposed on the first buildup-dielectric layer and the first pattern-metal layer, in which the second buildup-dielectric layer includes a second opening communicating to the first opening. An interposer board is disposed on the heat-storing device and in the second opening, and a second pattern-metal layer is disposed on the second buildup-dielectric layer and the interposer board. A third opening is forming at the first buildup-dielectric layer or the second buildup-dielectric layer. A thermoelectric device is disposed into the third opening for embedding the thermoelectric device in the first buildup-dielectric layer or the second buildup-dielectric layer, in which the thermoelectric device is connected to the heat-storing device through the first pattern-metal layer.

An aspect of the present invention provides a method for a circuit board with a heat-recovery function. The method includes a number of steps. At least one via is formed at a single-layer dielectric layer and a heat-conducting pillar is disposed in the via. The single-layer dielectric layer is built up for forming a substrate. A first recess and a second recess are respectively formed on two opposite surfaces of the substrate, in which the single-layer dielectric layer is between the first recess and the second recess. A thermoelectric device is disposed into the first recess for embedding the thermoelectric device in the substrate, in which the thermoelectric device is connected to the heat-conducting pillar. The other via is formed at a heat-storing device and the other via is filled with the other heat-conducting pillar. A processor is disposed on the heat-storing device, in which the processor is connected to the other heat-conducting pillar. The heat-storing device and the processor are disposed into the second recess for embedding the heat-storing device in the substrate, in which the heat-storing device is between the processor and the thermoelectric device.

BRIEF DESCRIPTION OF THE DRAWINGS

The invention can be more fully understood by reading the following detailed description of the embodiment, with reference made to the accompanying drawings as follows:

FIG. 2A to FIG. 2F are schematic side views according to a first embodiment of a method for manufacturing a circuit board of this invention;

FIG. 4A and FIG. 4B are schematic side views according to a second embodiment of a method for manufacturing a circuit board of this invention;

FIG. 6A to FIG. 6F are schematic side views according to a third embodiment of a method for manufacturing a circuit board of this invention.

DETAILED DESCRIPTION

Figure 1:
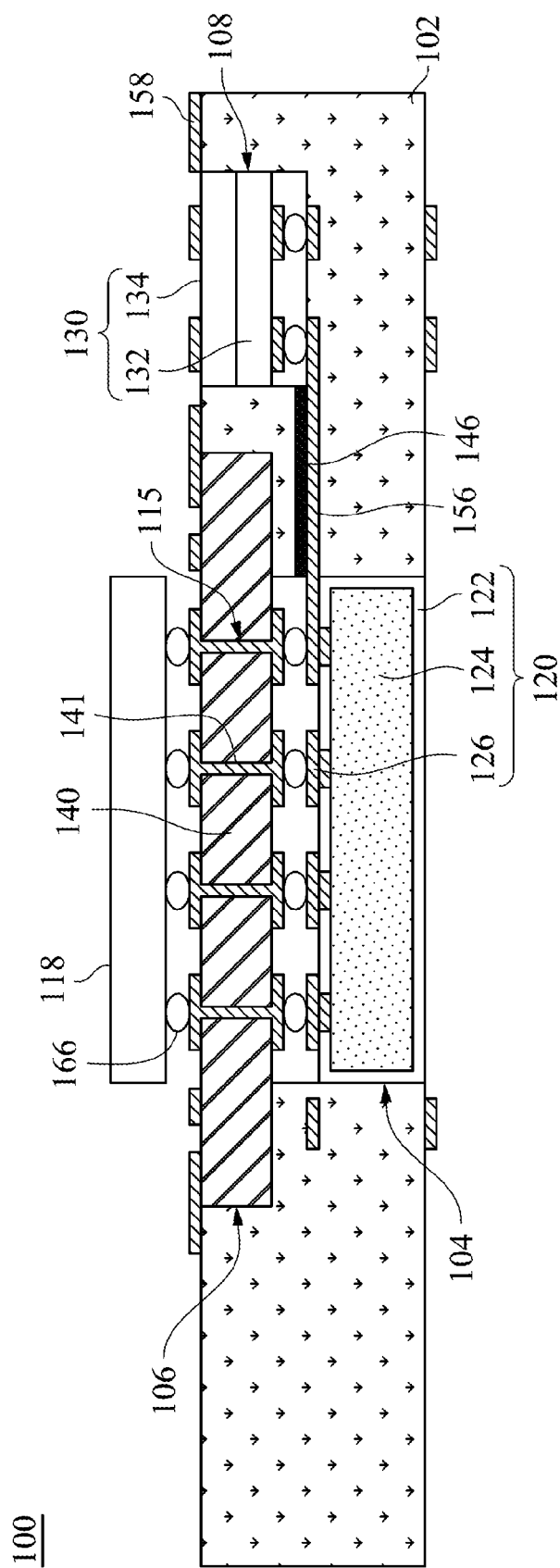
FIG. 1 is a schematic side view according to a first embodiment of a circuit board of this invention.

Reference will now be made in detail to the present embodiments of the invention, examples of which are illustrated in the accompanying drawings. Wherever possible, the same reference numbers are used in the drawings and the description to refer to the same or like parts.

It will be understood that, although the terms first, second, third etc. may be used herein to describe various elements, these elements should not be limited by these terms.

FIG. 1 is a schematic side view according to a first embodiment of a circuit board 100 of this invention. A circuit board 100 with a heat-recovery function includes a substrate 102, a heat-storing device 120, and a thermoelectric device 130. The heat-storing device 120 is embedded in the substrate 102 and connected to a processor 118 for performing heat exchange with the processor 118. The thermoelectric device 130 embedded in the substrate 102 includes a first metal-junction surface 132 and a second metal-junction surface 134. The first metal-junction surface 132 is connected to the heat-storing device 120 for performing heat exchange with the heat-storing device 120. The second metal-junction surface 134 is joined with the first metal-junction surface 132, in which the thermoelectric device 130 generates an electric potential by a temperature difference between the first metal-junction surface 132 and the second metal-junction surface 134.

In the present embodiment, the processor 118 may be a central processing unit (CPU) or graphic processing unit (GPU), in which the processor 118 can be connected to the circuit board 100 by pins. As the processor 118 operates, the temperature of the processor 118 is increased. When the temperature of the processor 118 is greater than the temperature of the heat-storing device 120, a temperature difference between the processor 118 and the heat-storing device 120 is generated, such that a thermal energy generated by the processor 118 is transmitted from the processor 118 to the heat-storing device 120. After the heat-storing device 120 absorbs the thermal energy, the temperature of the heat-storing device 120 is increased. Similarly, as the temperature of the heat-storing device 120 is greater than the temperature of the first metal-junction surface 132 of the thermoelectric device 130, the thermal energy in the heat-storing device 120 is transmitted from the heat-storing device 120 to the first metal-junction surface 132, such that a temperature difference between the first metal-junction surface 132 and the second metal-junction surface 134 is generated. Then, by a thermoelectric effect between the first metal-junction surface 132 and the second metal-junction surface 134, the thermoelectric device 130 can generate electrical energy, thereby providing an external element (not illustrated) with the electrical energy. For example, the thermoelectric device 130 may connect to a battery (not illustrated) as a power supply for the battery. In addition, since the heat-storing device 120 and the thermoelectric device 130 are embedded in the substrate 102, the circuit board 100 of the present invention is a circuit board with an embedded structure. That is, after the processor 118 disposed at the circuit board 100 starts operating, the circuit board 100 can perform the heat storage and the thermoelectric conversion so as to realize a heat-recovery function and a power-saving function.

The heat-storing device 120 further includes a housing 122, a phase-change material 124, and at least one connecting pad 126. The house 122 can be made of silicon dioxide ($SiO_2$) or ceramics. The housing 122 is filled with the phase-change material 124, in which the phase-change material 124 is a material with a high enthalpy of fusion. For example, the high enthalpy of fusion includes paraffin wax. The connecting pad 126 is disposed at the housing 122, in which the first metal-junction surface 132 of the thermoelectric device 130 is connected to the phase-change material 124 via the connecting pad 126.

Since the phase-change material 124 has the high enthalpy of fusion, the heat-storing device 120 can store the thermal energy therein. Therefore, even the operation of the processor 118 is finished, the heat-storing device 120 can perform the heat exchange with the first metal-junction surface 132 due to the temperature difference between the heat-storing device 120 and the first metal-junction surface 132, and the thermal energy is still transmitted to the first metal-junction surface 132. Furthermore, the melting point of the phase-change material 124 is selectively smaller than the average temperature of the operating processor 118, such that the phase-change material 124 can be maintained in the transition state of the phase changing. For example, the melting point of the phase-change material 124 is in a range from 45° C. to 65° C.

The circuit board 100 further includes an interposer board 140, a first patterned metal layer 156, and a second patterned metal layer 158. The interposer board 140 disposed between the heat-storing device 120 and the processor 118 includes at least one first via 115 and a first heat-conducting pillar 141. The first via 115 penetrates the interposer board 140. The first heat-conducting pillar 141 is disposed in the first via 115, in which the heat-storing device 120 performs heat exchange with the processor 118 through the first heat-conducting pillar 141.

The patterned metal layer 156 is located between the heat-storing device 120 and the thermoelectric device 130. The first metal-junction surface 132 is connected to the heat-storing device 120 through the first patterned metal layer 156, thereby performing the heat exchange with the heat-storing device 120. The second patterned metal layer 158 is disposed on surfaces of the substrate 102, the thermoelectric device 130, and the interposer board 140, in which the second patterned metal layer 158 is connected to the processor 118 and the thermoelectric device 130. The processor 118 and the thermoelectric device 130 can be connected to the other elements through the second patterned metal layer 158. For example, the processor 118 can perform data communication with the other elements or be driven through the second patterned metal layer 158. The electrical energy of the thermoelectric device 130 can be transmitted to the battery or the external element (not illustrated) through the second patterned metal layer 158.

The substrate 102 further includes a first opening 104, a second opening 106, and a third opening 108. The first opening 104 is disposed at the surface of the substrate 102, in which the heat-storing device 120 is located in the first opening 104. The second opening 106 is disposed at the other surface of the substrate 102 and opposite the first opening 104, and the first opening 104 and the second opening 106 are communicated with each other. A width of the first opening 104 is greater than a width of the second opening 106. Since the width of the first opening 104 is greater than the width of the second opening 106, the interposer board 140 can be positioned in the substrate 102 by the second opening 106.

The third opening 108 is disposed at the surface of the substrate 102, in which the second opening 106 and the third opening 108 are located at the same side of the substrate 102. Furthermore, the thermoelectric device 130 is in the third opening 108. However, a person having ordinary skill in the art may choose a proper position for the third opening 108. For example, the first opening 104 and the third opening 108 may be located at the same side of the substrate 102.

By disposing the heat-storing device 120, the thermoelectric device 130, and the interposer board 140 into the openings of the substrate 102, the thermoelectric converting structure of the circuit board 100 is embedded in the substrate 102. Therefore, the capacity of the circuit board 100 can be effectively used. Furthermore, the first heat-conducting pillar 141 of the interposer board 140, the heat-storing device 120, and the thermoelectric device 130 forms a heat-conducting path of the thermal energy generated by the processor 118 disposed on the circuit board 100 in sequence. In order to make the heat conducting between the elements (or devices) more effective, the circuit board 100 further includes a heat-conducting unit 146. The heat-conducting unit 146 is disposed between the elements interconnecting each other for improving the speed of the heat conducting, in which the heat-conducting unit 146 is made of metal, graphene or combinations thereof. For example, in FIG. 1, the heat-conducting unit 146 is disposed between the heat-storing device 120 and the thermoelectric device 130 for improving the speed of the heat conducting between the heat-storing device 120 and the thermoelectric device 130. In addition, the heat-conducting unit 146 also can be disposed in the first via 115 and cover the first heat-conducting pillar 141.

Furthermore, the circuit board 100 further includes solder balls 166. The solder balls 166 are disposed between the elements interconnecting each other for improving the fixing strength between the elements. For example, in FIG. 1, the solder balls 166 are disposed between the processor 118 and the interposer board 140 (or the second patterned metal layer 158), between the heat-storing device 120 and the interposer board 140, and between the thermoelectric device 130 and the first patterned metal layer 156. In addition, copper pads can be disposed at joints between the elements interconnecting each other for making the disposition of the solder balls 166 stable.

As previously mentioned, the circuit board 100 of the present invention has a structure that converts a thermal energy into an electrical energy. With the heat-storing device 120 and the thermoelectric device 130, the thermal energy generated by the processor 118 is stored in the heat-storing device 120 and then converted into the electrical energy by the thermoelectric device 130. Furthermore, the heat-storing device 120 and the thermoelectric device 130 of the circuit board 100 are embedded in the substrate 102, such that the capacity usage of the circuit board 100 is improved. Moreover, after the operation of the processor 118 is finished, the thermal energy stored in the heat-storing device 120 can be continuously converted into the electrical energy by the thermoelectric device 130, thereby providing the other operating elements or the battery with the electrical energy.

FIG. 2A to FIG. 2F are schematic side views according to a first embodiment of a method for manufacturing a circuit board of this invention. In the present embodiment, descriptions of a method for manufacturing a circuit board are provided with respect to the structure as the first embodiment of the circuit board 100 (see FIG. 1).

As shown in FIG. 2A, the step S10 is that a first buildup-dielectric layer 152 is provided and the first opening 104 is formed in the first buildup-dielectric layer 152.

As shown in FIG. 2B, the step S20 is that the heat-storing device 120 is disposed into the first opening 104 for embedding the heat-storing device 120 in the first buildup-dielectric layer 152. Then, metal layers 168 are disposed on two opposite surfaces of the first buildup-dielectric layer 152 and the heat-storing device 120.

As shown in FIG. 2C, the step S30 is that the first pattern-metal layer 156 and a third pattern-metal layer 160 are formed by patterning the metal layers 168 (see FIG. 2B). The first pattern-metal layer 156 is used for connecting the internal elements of the circuit board. The third pattern-metal layer 160 is used for connecting the circuit board to the external elements (not illustrated). A person having ordinary skill in the art may choose a proper pattern of the third pattern-metal layer 160 according to a relationship between arrangements of the circuit board and the external elements. Furthermore, in the step S30, the heat-conducting unit 146 may be disposed between the heat-storing device 120 and a predetermined position of the thermoelectric device 130 (see FIG. 1).

As shown in FIG. 2D, the step S40 is that a second buildup-dielectric layer 154 is disposed on the first buildup-dielectric layer 152 and the first pattern-metal layer 156. The substrate 102 of the circuit board (see FIG. 1) is formed by combining the first buildup-dielectric layer 152 and the second buildup-dielectric layer 154. Then, the second opening 106 is formed at the second buildup-dielectric layer 154. The first opening 104 and the second opening 106 are communicated to each other, and the width of the second opening 106 is greater than the width of the first opening 104.

As shown in FIG. 2E, the step S50 is that the interposer board 140 is disposed on the heat-storing device 130 and in the second opening 106. As previously mentioned, as interposer board 140 is disposed in the second opening 106, the interposer board 140 can be positioned in the second opening 106 since the width of the second opening 106 is greater than the first opening 104, such that the distortion is prevented during positioning the element. Then, the metal layer 168 is disposed on the second buildup-dielectric layer 154 and the interposer board 140. In the present embodiment, the interposer board 140 can be processed first for forming the first via 115 penetrating the interposer board 140. The first heat-conducting pillar 141 is disposed in the first via 115, in which the metal layer 168 is connected to the first via 115. Similarly, in order to improve the fixing strength between the heat-storing device 120 and the interposer board 140, the solder balls 166 and the copper pads may be disposed between the heat-storing device 120 and the interposer board 140.

As shown in FIG. 2F, the step S60 is that the second pattern-metal layer 158 is formed by patterning the metal layer 168 (see FIG. 2E) and the third opening 108 is formed at the second buildup-dielectric layer 154. Then, the thermoelectric device 130 is disposed into the third opening 108 for embedding the thermoelectric device 130 in the second buildup-dielectric layer 154. The thermoelectric device 130 in the third opening 108 is connected to the heat-storing device 120 through the heat-conducting unit 146 and the first pattern-metal layer 156. Similarly, in order to improve the fixing strength, the solder balls 166 and the copper pads may be disposed between the thermoelectric device 130 and the first pattern-metal layer 156.

In the present embodiment, the third opening 108 is formed at a predetermined position of the thermoelectric device 130. A person having ordinary skill in the art may choose a proper position of the thermoelectric device 130 according to the different arrangements of the circuit board. For example, the third opening 108 may be formed at the first buildup-dielectric layer 152.

After the step that disposing the thermoelectric device 130, the structure of the circuit board has been built simultaneously. Then, the processor 118 (see FIG. 1) is disposed on the interposer board 140, and the structure of the circuit board 100 as shown in FIG. 1 is formed.

Figure 3:
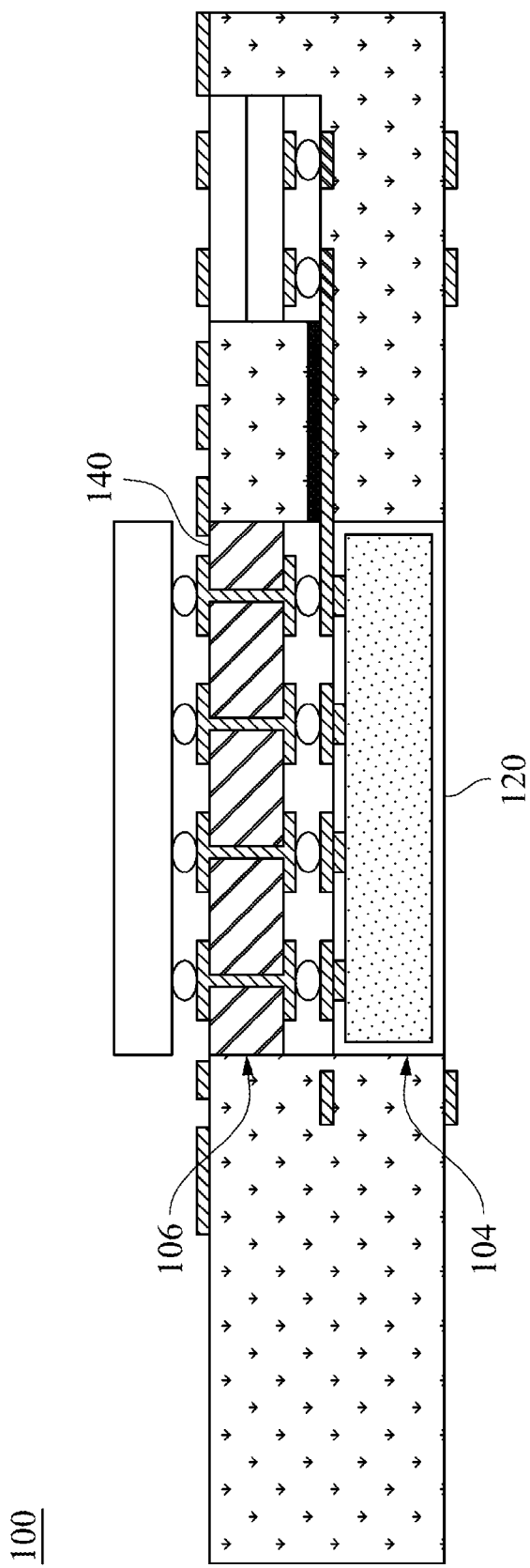
FIG. 3 is a schematic side view according to a second embodiment of a circuit board of this invention.

FIG. 3 is a schematic side view according to a second embodiment of a circuit board 100 of this invention. The difference between the present embodiment and the first embodiment of the circuit board 100 is that the first opening 104 and the second opening 106 have the same dimension (or the same width). In the present embodiment, the first opening 104 and the second opening 106 have the same width, and the heat-storing device 120 and the interposer board 140 have the same width. In this configuration, the manufacturing flow of the circuit board 100 is more flexible. The following descriptions are provided with respect to the manufacturing flow of the circuit board 100 of the FIG. 3.

FIG. 4A and FIG. 4B are schematic side views according to a second embodiment of a method for manufacturing a circuit board of this invention. The difference between the present embodiment and the first embodiment of the method for manufacturing the circuit board circuit board is that the step that disposing the interposer board 140 is earlier than the step that disposing the second buildup-dielectric layer 154 on the first pattern-metal layer 156.

As shown in FIG. 4A, the step S40' is that the interposer board 140 is disposed on the first pattern-metal layer 156, and then the second buildup-dielectric layer 154 is disposed on the first buildup-dielectric layer 152 and around the interposer board 140. In the present embodiment, after the step that disposing the second buildup-dielectric layer 154, the second opening 106 of the second buildup-dielectric layer 154 is formed simultaneously, in which the first opening 104 and the second opening 106 have the same dimension (or the same width). In other words, the second opening 106 is formed at the position of the interposer board 140.

As shown in FIG. 4B, the step S50' is that the metal layer 168 is disposed on the interposer board 140 and the second buildup-dielectric layer 154 so as to perform sequential processes. After the step of disposing the metal layer 168, the sequential processes are the same with the step S60 (see FIG. 2F) of the first embodiment of the method for manufacturing the circuit board. Since the process and the detailed structure are the same as those in the first embodiment of the method, they are not repeated herein.

As previously mentioned, the steps that disposing the interposer board 140 and forming the second buildup-dielectric layer 154 can be performed with different orders. In the present embodiment, disposing the interposer board 140 is earlier than the step that disposing the second buildup-dielectric layer 154. A person having ordinary skill in the art may choose proper orders of the steps that disposing the interposer board 140 and forming the second buildup-dielectric layer 154.

Figure 5:
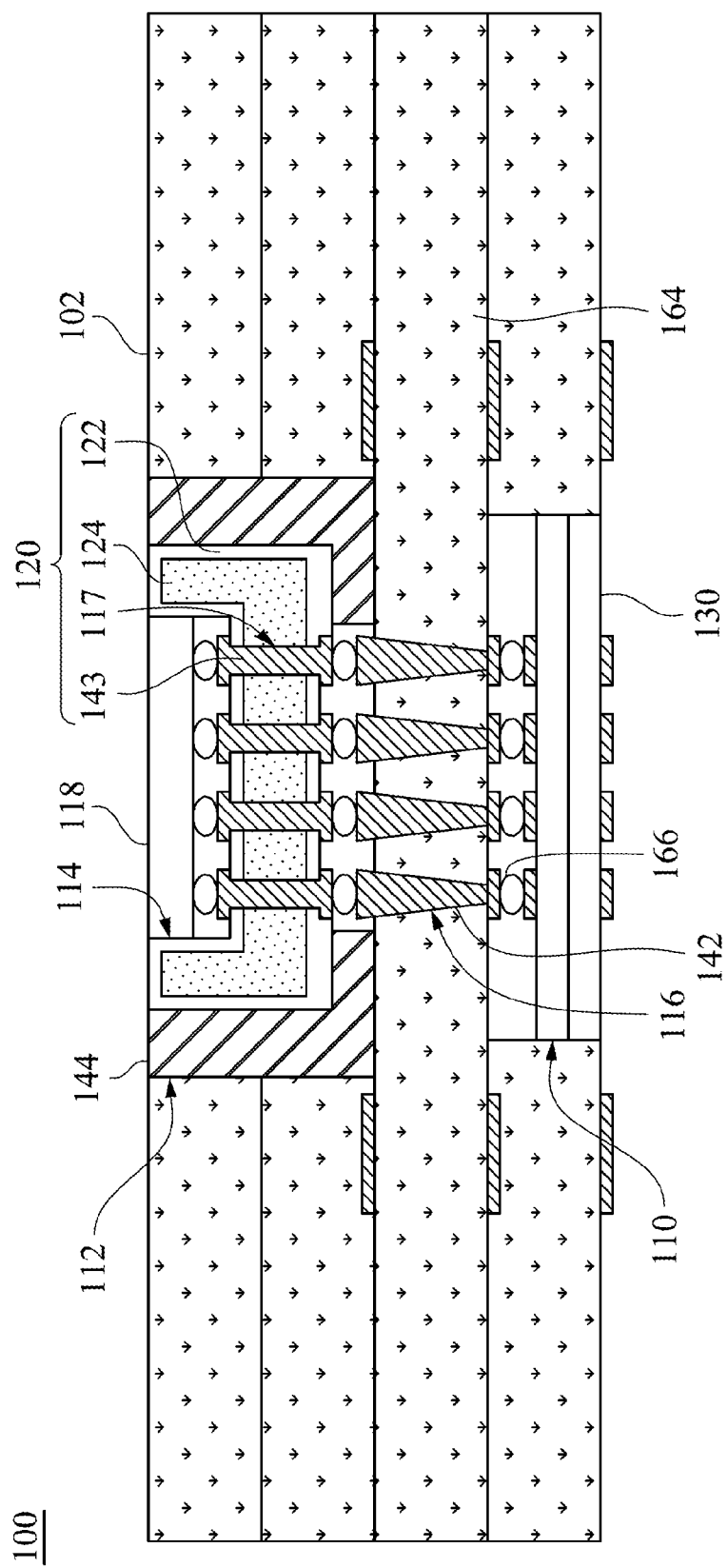
FIG. 5 is a schematic side view according to a third embodiment of a circuit board of this invention.

FIG. 5 is a schematic side view according to a third embodiment of a circuit board 100 of this invention. The difference between the present embodiment and the first embodiment of the circuit board 100 is that the heat-storing device 120, the thermoelectric device 130, and the interposer board 140 are disposed with a vertical arrangement. In addition, since the material and the detailed structure are the same as those in the first embodiment of the circuit board, they are not repeated herein.

As shown in FIG. 5, the substrate 102 has a multiple layered structure and includes a first recess 110, a second recess 112, second via 116, and a second heat-conducting pillar 142. The first recess 110 is disposed at a surface of the substrate 102, in which the thermoelectric device 130 is located in the first recess 110. The second recess 112 is disposed at the other surface of the substrate 102, in which the heat-storing device 120 is located in the second recess 112. The first recess 110 and the second recess 112 are opposite to each other, and at least one portion of the substrate 102 is located between the heat-storing device 120 and the thermoelectric device 130. The portion of the substrate 102 is a single dielectric layer 164 of the substrate 102. The second via 116 is disposed at the single dielectric layer 164 between the heat-storing device 120 and the thermoelectric device 130, in which the second via 116 penetrates the single dielectric layer 164. The second heat-conducting pillar 142 is disposed in the second via 116, in which the heat-storing device 120 performs heat exchange with the thermoelectric device 130 through the second heat-conducting pillar 142.

In the present embodiment, a heat-conducting path is arranged in the vertical direction. However, according to a relationship between the positions of the circuit board 100 and the elements supplied the electrical energy by the thermoelectric device 130, a person having ordinary skill in the art may choose the proper arrangement of the circuit board 100 with the first, the second, or the third embodiment.

The circuit board 100 further includes a fixing frame 144. The fixing frame 144 is disposed in the second recess 112, in which the heat-storing device 120 is located in the fixing frame 144. The heat-storing device 120 further includes a third recess 114, in which the processor 118 is located in the third recess 114. The surfaces of the substrate 102, the fixing frame 144, the heat-storing device 120, and the processor 118 are coplanar. In other words, the fixing frame 144, the heat-storing device 120, and the processor 118 of the present embodiment are embedded in the substrate 102. Moreover, since the processor 118 is disposed in the third recess 114 of the heat-storing device 120, the heat-conducting path from the processor 118 to the heat-storing device 120 is shortened. Therefore, the heat-storing device 120 can absorb the thermal energy generated by the processor 118 effectively and directly.

The heat-storing device 120 further includes a housing 122, a phase-change material 124, at least one third via 117, and a third heat-conducting pillar 143. The housing 122 is filled with the phase-change material 124. The third via 117 penetrates the heat-storing device 120. The third heat-conducting pillar 143 is disposed in the third via 117, in which the processor 118 performs heat exchange with the first metal-junction surface 132 of the thermoelectric device 130 through the second heat-conducting pillar 142 and the third heat-conducting pillar 143.

Furthermore, both the processor 118 and the heat-storing device 120 can perform heat exchange with each other through the third heat-conducting pillar 143. That is, the thermal energy generated by the processor 118 is absorbed by the phase-change material 124 of the heat-storing device 120 through the third heat-conducting pillar 143. In this configuration, a heat-conducting area between the processor 118 and the heat-storing device 120 is greater, and hence the heat-conducting efficiency between the processor 118 and the heat-storing device 120 is improved.

Similarly, in order to improve the heat-conducting efficiency between the internal elements of the circuit board 100, the heat-conducting unit (not illustrated) can be disposed on the surface of the second heat-conducting pillar 142, on the surface of the third heat-conducting pillar 143, or between the elements interconnecting each other. In addition, in order to improve the fixing strength between the elements interconnecting each other, the copper pads and the solder balls 166 may be disposed between the elements interconnecting each other. For example, between the processor 118 and the heat-storing device 120 or between the heat-storing device 120 and the thermoelectric device 130.

FIG. 6A to FIG. 6F are schematic side views according to a third embodiment of a method for manufacturing a circuit board of this invention. In the present embodiment, descriptions of a method for manufacturing a circuit board are provided with respect to the structure as the third embodiment of the circuit board 100 (see FIG. 5).

As shown in FIG. 6A, the step S110 is that the heat-storing device 120 is provided with the third recess 114. Then, the third via 117 is formed at the heat-storing device 120 with penetrating the heat-storing device 120, and the third heat-conducting pillar 143 is disposed in the third via 117.

As shown in FIG. 6B, the step S120 is that the processor 118 is disposed on the heat-storing device 120, in which the solder balls 166 and the copper pads can be disposed between the processor 118 and the heat-storing device 120 for improving the fixing strength between the processor 118 and the heat-storing device 120. The processor 118 is disposed in the third recess 114 and connected to the third heat-conducting pillar 143. Then the heat-storing device 120 is disposed in the fixing frame 144.

As shown in FIG. 6C, the step S130 is that the substrate 102 having the multiplayer structure is provided, in which the substrate is formed by building up the single-layer dielectric layer 164. Therefore, at the beginning of the step S130, the second via 116 is formed at the single-layer dielectric layer 164 and the second heat-conducting pillar 142 is disposed in the second via 116. Furthermore, in the step that building up the single-layer dielectric layer 164, the fourth patterning-metal layer 162 may be formed as a circuit layer in the circuit board.

Figure 6D:
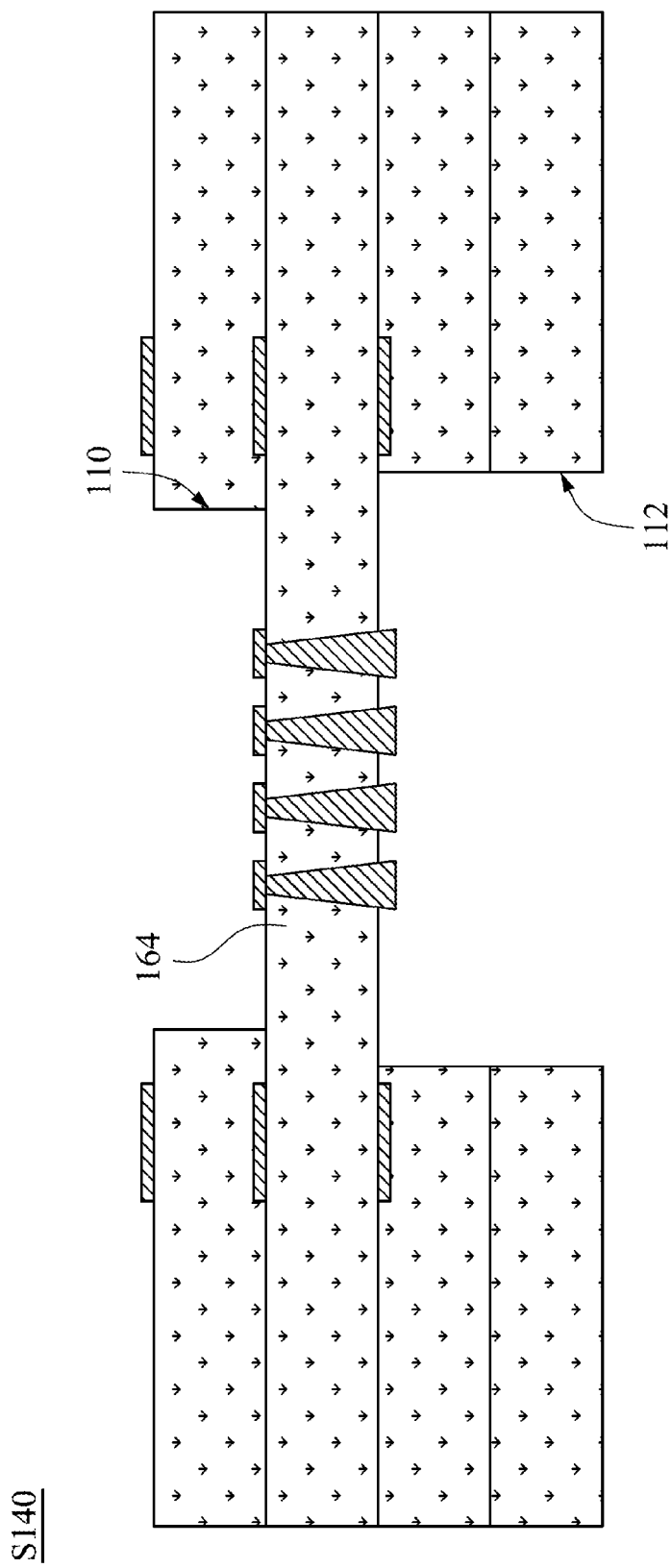

As shown in FIG. 6D, the step S140 is that the first recess 110 and the second recess 112 are respectively formed on two opposite surfaces of the substrate 102. The first recess 110 and the second recess 112 are opposite to each other, and the single-layer dielectric layer 164 is between the first recess 110 and the second recess 112.

Figure 6E:
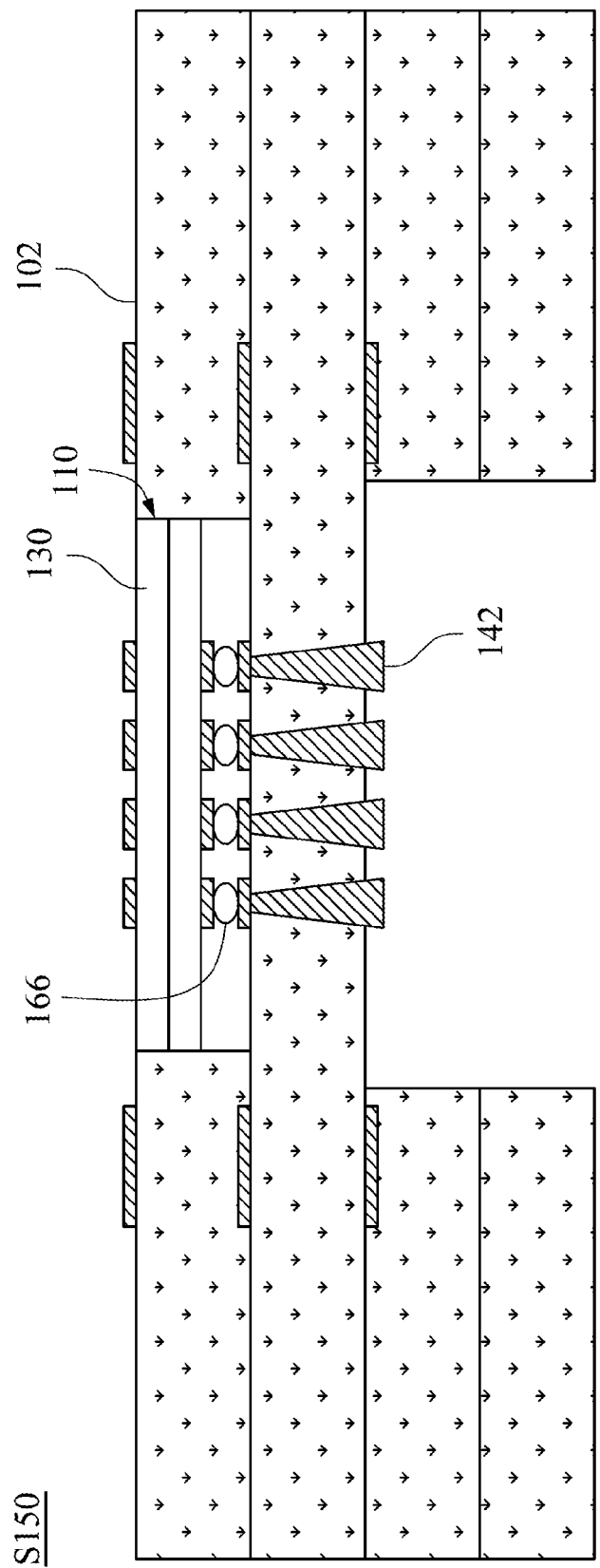

As shown in FIG. 6E, the step S150 is that the thermoelectric device 130 is disposed into the first recess 110 for embedding the thermoelectric device 130 in the substrate 102, in which the thermoelectric device 130 is connected to the heat-conducting pillar 142. Similarly, the solder balls 166 and copper pads may be disposed between the thermoelectric device 130 and the second heat-conducting pillar 142 for improving the fixing strength between the thermoelectric device 130 and the second heat-conducting pillar 142.

Figure 6F:
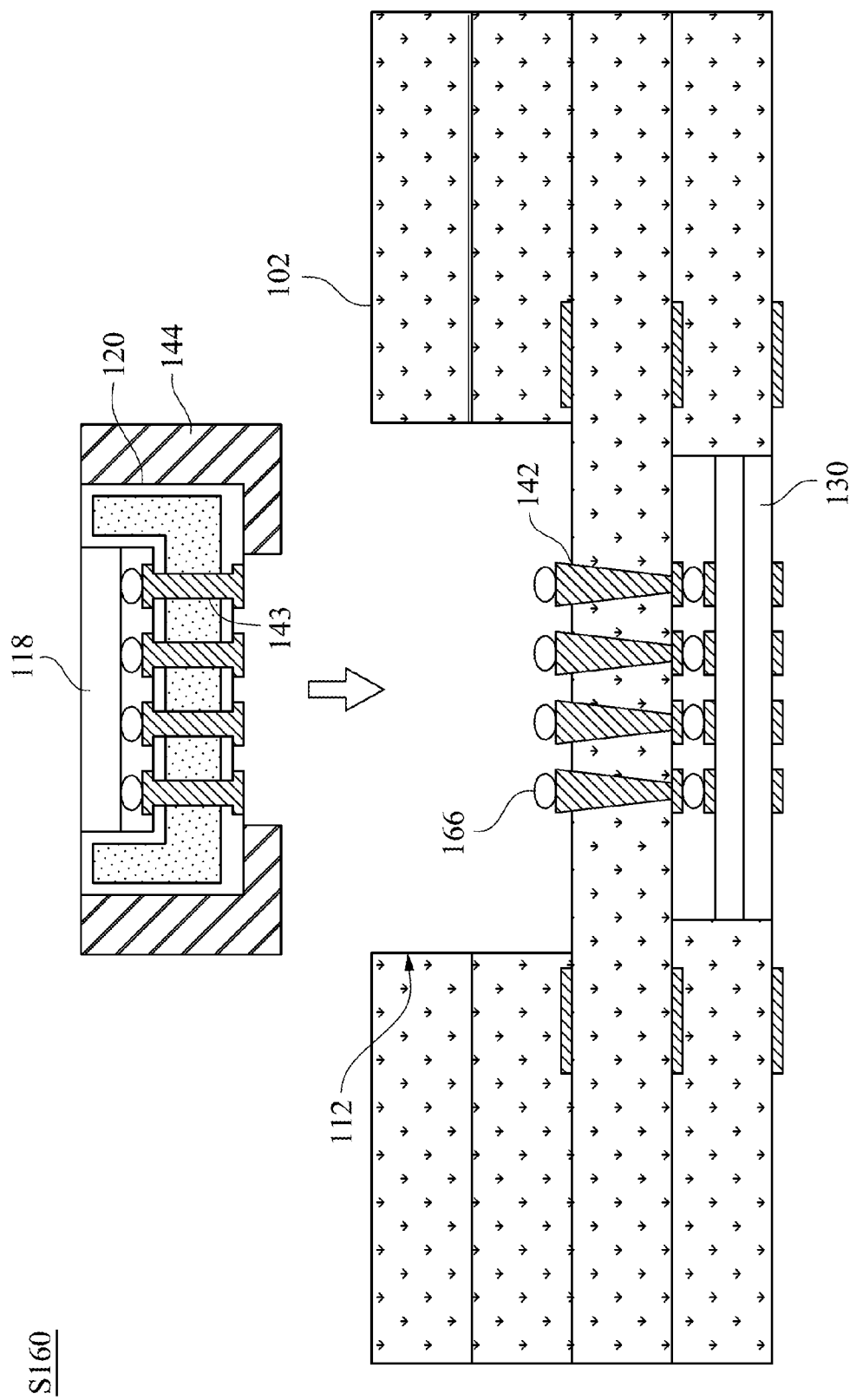

As shown in FIG. 6F, the step S160 is that the substrate 102 is turned over for performing surface mount technology (SMT). Then, the processor 118, the heat-storing device 120, and the fixing frame 140 arranged in the step S120 are disposed in the second recess 112 for embedding the elements in the substrate 102, in which the heat-storing device 120 is between the processor 118 and the thermoelectric device 130. In other words, the processor 118, the heat-storing device 120, the thermoelectric device 130, and the fixing frame 140 are embedded in the substrate 102 along the same direction. Similarly, in order to improve the fixing strength between the second heat-conducting pillar 142 and the third heat-conducting pillar 143, the solder balls 166 and copper pads can be disposed between the second heat-conducting pillar 142 and the third heat-conducting pillar 143.

As previously mentioned, the circuit board of the present invention has the embedded structure and includes the heat-storing device and the thermoelectric device embedded in the substrate. The heat-storing device is used for storing the waste heat generated by the processor. The thermoelectric device is used for converting the thermal energy stored in the heat-storing device into the electrical energy. Therefore, as the processor disposed on the circuit board starts operating, the thermal energy generated by the processor is stored and transmitted to the thermoelectric device, and then the thermal energy is converted into the electrical energy. In addition, since the thermal energy can be stored in the heat-storing device, the thermal energy can be converted into the electrical energy by the thermoelectric device after the operation of the processor is finished. Therefore, the other operating elements can continuously receive the electrical energy, thereby realizing the effect of saving energy.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A circuit board with a heat-recovery function, comprising:
   a substrate having a top surface and a bottom surface which are opposite to each other;
   a heat-storing device embedded in the substrate and connected to a processor for performing heat exchange with the processor; and
   a thermoelectric device embedded in the substrate, comprising:
      a first metal-junction surface connected to the heat-storing device for performing heat exchange with the heat-storing device; and
      a second metal-junction surface joined with the first metal-junction surface, wherein the thermoelectric device generates an electric potential by a temperature difference between the first metal-junction surface and the second metal-junction surface, wherein the substrate further comprises:
      a first recess disposed at the top surface of the substrate, wherein the thermoelectric device is located in the first recess;
      a second recess disposed at the bottom surface of the substrate, wherein the heat-storing device is located in the second recess, the first recess and the second recess are opposite to each other, and at least one portion of the substrate is located between the heat-storing device and the thermoelectric device;
      at least one first via disposed at the portion of the substrate between the heat-storing device and the thermoelectric device; and
      a first heat-conducting pillar disposed in the first via, wherein the heat-storing device performs heat exchange with the thermoelectric device through the first heat-conducting pillar.

2. The circuit board of claim 1, wherein the heat-storing device further comprises:
   a housing;
   a phase-change material, where the housing is filled with the phase-change material;
   at least one second via penetrating the heat-storing device;
   a second heat-conducting pillar disposed in the second via, wherein the processor performs heat exchange with the first metal-junction surface of the thermoelectric device through the second heat-conducting pillar.

3. The circuit board of claim 1, further comprising a fixing frame disposed in the second recess, wherein the heat-storing device is located in the fixing frame, the heat-storing device further comprises a third recess, the processor is located in the third recess, and the surfaces of the substrate, the fixing frame, the heat-storing device, and the processor are coplanar.

4. The circuit board of claim 1, further comprising:
   a heat-conducting unit disposed between the heat-storing device and the processor or between the heat-storing device and the thermoelectric device, wherein the heat-conducting unit is made of metal, graphene or combinations thereof.

* * * * *